(12) United States Patent
Wen et al.

(10) Patent No.: US 7,411,278 B2
(45) Date of Patent: Aug. 12, 2008

(54) PACKAGE DEVICE WITH ELECTROMAGNETIC INTERFERENCE SHIELD

(75) Inventors: Chau Chun Wen, Taoyuan (TW); Da-Jung Chen, Taoyuan (TW); Chun-Liang Lin, Tainan (TW); Chih-Chan Day, Tainan (TW)

(73) Assignee: Cyntec Co., Ltd., Hsin-chu (TW)

( * ) Notice: Subject to any disclaimer, the term of this patent is extended or adjusted under 35 U.S.C. 154(b) by 201 days.

(21) Appl. No.: 11/336,973

(22) Filed: Jan. 23, 2006

(65) Prior Publication Data

US 2007/0096293 A1  May 3, 2007

(30) Foreign Application Priority Data

Nov. 3, 2005 (TW) .............................. 94138595 A

(51) Int. Cl.
*H01L 23/552* (2006.01)
(52) U.S. Cl. ...................................... 257/659; 257/666
(58) Field of Classification Search .................. 257/659, 257/666, 723, 724, 698
See application file for complete search history.

(56) References Cited

U.S. PATENT DOCUMENTS

| | | | |
|---|---|---|---|
| 4,835,598 A * | 5/1989 | Higuchi et al. ............... | 257/668 |
| 5,406,117 A * | 4/1995 | Dlugokecki et al. ......... | 257/659 |
| 5,486,720 A * | 1/1996 | Kierse ......................... | 257/659 |
| 5,650,659 A * | 7/1997 | Mostafazadeh et al. ..... | 257/660 |
| 5,889,316 A * | 3/1999 | Strobel et al. ............... | 257/659 |
| 6,781,223 B2 * | 8/2004 | Mihara et al. ............... | 257/684 |
| 6,989,588 B2 * | 1/2006 | Quinones et al. ............ | 257/680 |
| 7,202,552 B2 * | 4/2007 | Zhe et al. ..................... | 257/659 |
| 2003/0006501 A1 * | 1/2003 | Waki et al. ................... | 257/707 |
| 2006/0192276 A1 * | 8/2006 | Kamiya ....................... | 257/679 |
| 2007/0013036 A1 * | 1/2007 | Zhe et al. ..................... | 257/659 |

\* cited by examiner

*Primary Examiner*—S. V Clark
(74) *Attorney, Agent, or Firm*—Birch, Stewart, Kolasch & Birch, LLP

(57) ABSTRACT

The present invention provides a package device for reducing the electromagnetic/radio frequency interference, which includes a first substrate with a shielding structure on the under surface of the first substrate, and an insulating layer on the shielding structure. The first substrate includes a through hole that is filled with the conductor therein. A plurality of lead-frames located on the bottom surface of the first substrate. A second substrate located above between the two lead-frames. Then, the molding compound encapsulated to cover the above structures to form a package device. Therefore, the shielding path of the package device is constructed of the plurality of lead-frames, the conductor within the first substrate, the shielding structure, and the grounded to discharge the electromagnetic/radio frequency out of the package device, thus, the electromagnetic/radio frequency interference for the package device can be reduced.

26 Claims, 5 Drawing Sheets

PACKAGE DEVICE WITH ELECTROMAGNETIC INTERFERENCE SHIELD

BACKGROUND OF THE INVENTION

1. Field of the Invention

The present invention generally relates to a package device, particularly to indicate to a package device with electromagnetic interference shield.

2. Description of the Prior Art

In recently, the electrical technology is developed rapidly, and the electronic equipment is used for widely application. Because of the electromagnetic interference is generated from the electronic equipment and the restraint is generated from the environment of the electronic equipment, the electromagnetic compatibility for the electronic equipment is an important issue to consider. The objective of the shielding structure is that preventing the performance of other electronic devices is to be reduced, or the damage to the inside electronic device.

In general, the electromagnetic/radio frequency interference would be caused by the package device is that the interaction between the every electronic devices located on the package device. For example, the noise capacitance and inductance would be influenced the package device when the work current passed through the conductive wirings, or the signal passed through the grounded line, or the mutual inductance is caused between the conductive wirings.

FIG. 1 shows the package device that utilizes the metal sheet to be an electromagnet interference shield. The package device includes a substrate which consisted of an insulating layer 110/a metal sheet 112/an insulating layer 114, wherein the metal sheet 112 is a shielding structure for reducing the electromagnetic/radio frequency interference, and a heat dissipation apparatus which is attached to another insulating layer 114. The conventional separating apparatus 116 consisted of a plurality of power devices, which is electrically coupled with the printed circuit board 122 through the pin 120. Thus, the electromagnetic/radio frequency is generated from the package device that can be discharged or eliminated through the printed circuit board 122 to the grounded (not shown).

The heat is generated from the conventional separating apparatus 116 in the package device. The heat is dissipated via the heat dissipation apparatus 118 for the package device. However, the heat dissipating capability is not good for the insulating layer 114. The heat is generated from the power devices 116 that would be dissipated through the insulating layer 110/metal sheet 112/insulating layer 114 to the heat dissipation apparatus 118 to affect the stability of the package device. Even the electromagnetic/radio frequency interference of the package device can be discharged by external connecting to the printed circuit board 122 and the grounded (not shown in figure).

FIG. 2 shows another conventional separating apparatus structure for the package device. According to the above illustration of FIG. 1, the capability of the substrate is not good for heat dissipating when the constructed material is insulating layer 110/metal sheet 112/insulating layer 114. Therefore, the difference between the FIG. 1 and FIG. 2 is that the shielding structure is a single insulating layer 110. The insulating layer 110 is electrically coupled with the power device 116, and another side of insulating layer 110 is attached to the heat dissipation apparatus 118. Similarly, the power device 116 is electrically coupled with the printed circuit board 122 through the pin 120. Another difference between FIG. 1 and FIG. 2 is that the package device is electrically coupled with the shielding structure via the conductor. Herein, the shielding structure is a single layer which consisted of the metal layer 126 and the printed circuit board 128, or a multilayer structure which consisted of alternated a plurality of metal layers 126 and a plurality of printed circuit boards 128. The single layer or multilayer of shielding structure is used for discharging the electromagnetic/radio frequency from the printed circuit board 128 through the power device 116, the shielding structure to the conductor 124 to form a shielding path of discharging the electromagnetic/radio frequency. According to the above discussion would be obtained the heat dissipating path for the package device, but the fabricating of the package device is still difficult and the cost would be increased.

SUMMARY OF THE INVENTION

In accordance with the above background prior art, in order to solve the electromagnetic/radio frequency interference for the package device, the present invention provides a package device with electromagnetic interference shield, whereby the power density of the package device system can be increased.

It is another object of this invention to provide a shield structure that located between the substrate and insulating layer. The electromagnetic/radio frequency can be discharged to the outside of the package device from the substrate through the metal plate to the grounded. Thus, the other system would not be affected by the electromagnetic/radio frequency interference in the package device. Also, the immunity against the electromagnetic/radio frequency interference can be increased.

According to above objects, the present invention provides a package device with electromagnetic interference shield, which includes a substrate with/without wirings, a metal plate which is formed above the bottom surface of the substrate, and an insulating layer which is formed below the metal plate. In addition, the through hole with the conductor therein that located between the substrate with/without wirings and metal plate to conduct the electricity between the substrate with/without wirings and metal plate. Otherwise, the side connecting structure is formed on the side surface of the substrate with/without wirings, and is electrically coupled to the metal plate. Then, package device further includes the plurality of lead-frames that located above the substrate with/without wirings, and the printed circuit board that located on the portion of the two lead-frames. The plurality of first electronic devices located on the plurality of lead-frames respectively, and the plurality of second electronic device located on the printed circuit board. Thus, the electricity between the plurality of lead-frames, the printed circuit board, and the plurality of first electronic devices is electrically coupled together by the plurality of conductive wires. The plurality of first electronic devices is electrically coupled to each other and to the plurality of lead-frames by the plurality of conductive wires. Next, the molding compound is encapsulated to cover the portion of the substrate, the plurality of first electronic devices, the plurality of second electronic devices, the plurality of the lead-frames, and to expose the lead of the plurality of lead-frames. Thus, the shielding path is constructed by the conductor within the substrate with/without the wirings or by the side connecting structure which located on the side surface of the substrate with/without wirings that can discharge the electromagnetic/radio frequency to the outside of the package device from the plurality of lead-frames to the grounded.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Some sample embodiments of the invention will now be described in greater detail. Nevertheless, it should be recognized that the present invention can be practiced in a wide range of other embodiments besides those explicitly described, and the scope of the present invention is expressly not limited except as specified in the accompanying claims.

Figure 1:
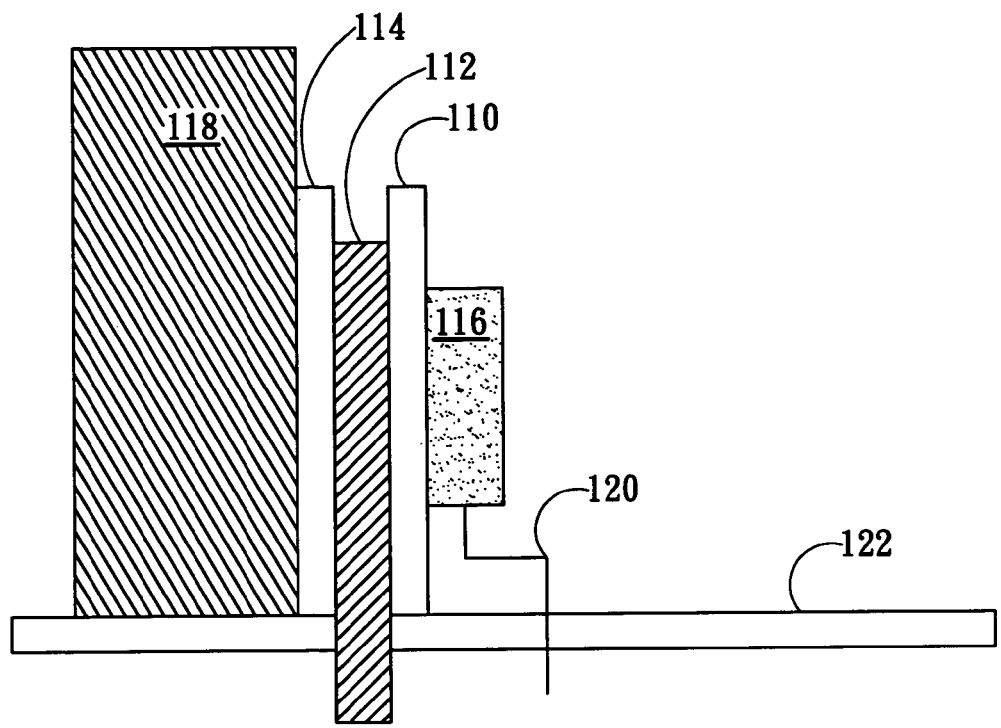
FIG. 1 is a cross-sectional view showing a metal sheet to be an shielding structure to reduce the electromagnetic/radio frequency interference for the package device in accordance with the prior art.
Figure 2:
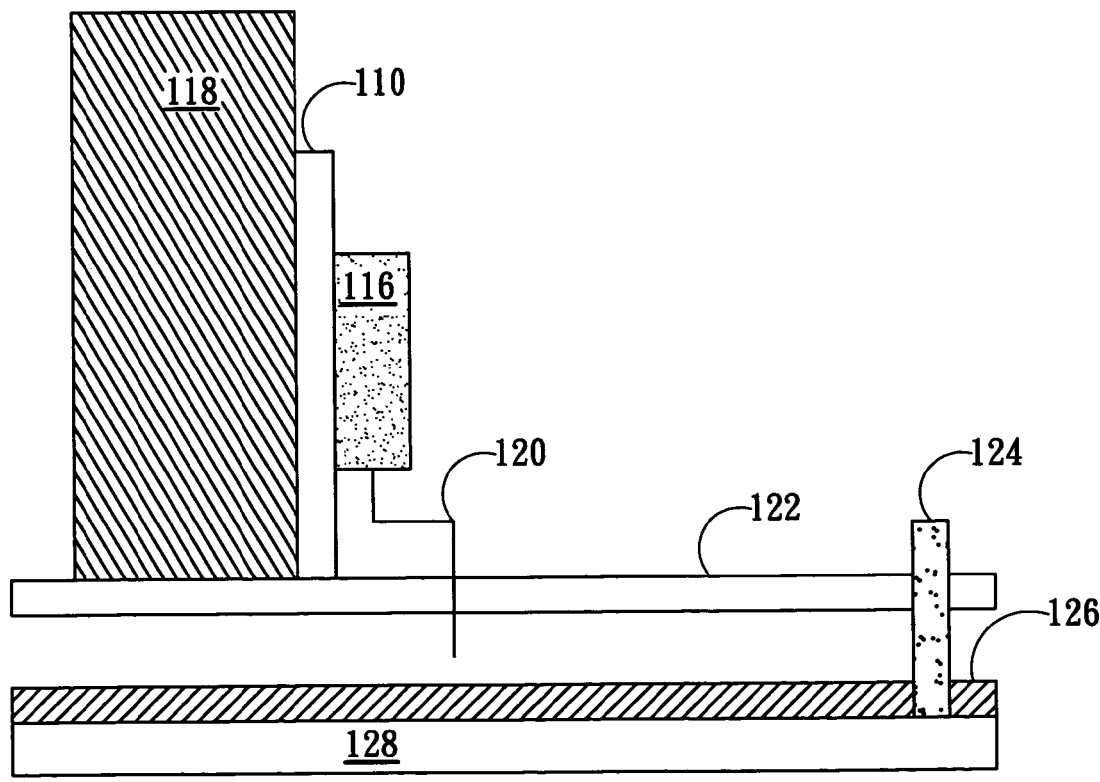
FIG. 2 is a cross-sectional view showing another conventional package device with electromagnetic interference shield in accordance with the prior art.
Figure 3:
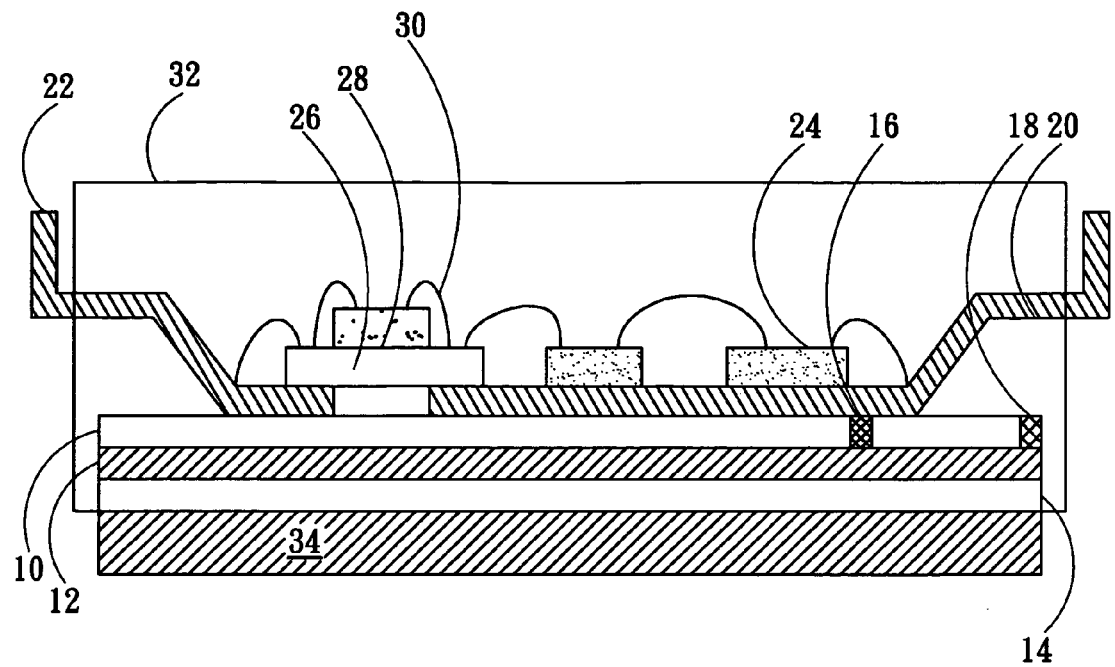
FIG. 3 is a cross-sectional view showing a package device with electromagnetic interference shield to reduce the electromagnetic/radio frequency interference in according to one embodiment of the present invention.

FIG. 3 shows the preferred embodiment of the present invention for the package device with electromagnetic interference shield. The package device with an electromagnetic interference shield includes a first substrate 10 without wirings thereon/therein, a shielding structure 12, a plurality of lead-frames 20, a plurality of first electronic devices 24, a second substrate 26, a plurality of second electronic devices 28, and a plurality of conductive wires 30.

The shielding structure 12 located under the bottom surface of the first substrate 10 without wirings, the insulating layer 14 located under the shielding structure 12, the plurality of lead-frames 20 located above the surface of the first substrate 10 without wirings, the plurality of first electronic devices 24 located on the plurality of lead-frames 20 by using the die attach material (not shown), the second substrate 26 located on the two lead-frames 20, and the plurality of second electronic devices 28 located on the second substrate 26 by using die attach material. It is noted that the plurality of conductive wires 30 electrically coupled with the electricity between the plurality of lead-frames 20, the second substrate 26, and the plurality of second electronic devices 28. Similarly, the electricity between the plurality of first electronic device 24 and the second substrate 28, and the plurality of lead-frames 20 and the plurality of first electronic devices 24 is electrically coupled together by using the plurality of conductive wires 30.

In this preferred embodiment, in order to conduct the electricity between the plurality of lead-frames 20 and the shielding structure 12, an electricity connector is formed on the side surface of the first substrate 10 without wirings thereon/therein. The formation method of the electricity connector includes at least one through hole 16 that is formed within the first substrate 10 without wirings to pass through the first substrate 10 without wirings to the shielding structure 12. Then, a conductor is formed in the through hole 16 to be an electrical connecting structure by electroplating or another well-known technology. Thus, the conductor within the through hole 16 can electrically connect the electricity between the plurality of lead-frames 20 and the shielding structure 12. In addition, another electrical connecting structure is a thin conductive layer that is formed on the side surface of the first substrate 10 without wirings to be a side connecting structure 18, which used to electrically couple the plurality of lead-frames 20 and the shielding structure 12. Also, the side connecting structure 18 can electrically couple with the grounded (not shown). It is noted that the material of first substrate 10 without wirings can be made of insulating material such as ceramic.

Moreover, the shielding structure 12 can be made of a metal plate or a metal layer with good capability of electric conductivity. The metal plate or metal layer used to discharge the electromagnetic/radio frequency to the grounded (not shown) from the shielding structure 12 through the plurality of lead-frames 20 to reduce the electromagnetic/radio frequency interference for the package device.

The electricity between the plurality of lead-frames 20, the plurality of first electronic devices 24, the second substrate 26, and the plurality of second electronic devices 28 can connect by the wire boding technology or die attach technology according to the user requirement.

Finally, the molding compound 32 is encapsulated to cover the plurality of first electronic devices 24, the plurality of second electronic devices 28, the portion of the plurality of lead-frames 20, the plurality of conductive wires 30, the first substrate 10 without wirings, the shielding structure 12, and the side surface of the insulating layer 14, and to expose the bottom surface of the insulating layer 14. It is noted that the shielding path is constructed of the plurality of lead-frames 20, the electrical connecting structure, and the shielding structure 12. Therefore, the electromagnetic/radio frequency can be discharged by the shielding path to reduce the electromagnetic/radio frequency interference when the package device with electromagnetic interference shield is operating.

In addition, the package device with electromagnetic interference shield further includes a heat dissipation apparatus 34 that is attached on the bottom surface of the insulating layer 14. Therefore, the heat can be removed to the outside of package device with electromagnetic interference shield through the shielding path to the heat dissipation apparatus 34. Otherwise, the heat also can be removed from the every leads 22 of the plurality of lead-frames 20 to the outside of the package device with electromagnetic interference shield to reduce the operating temperature for the package device.

Figure 4:
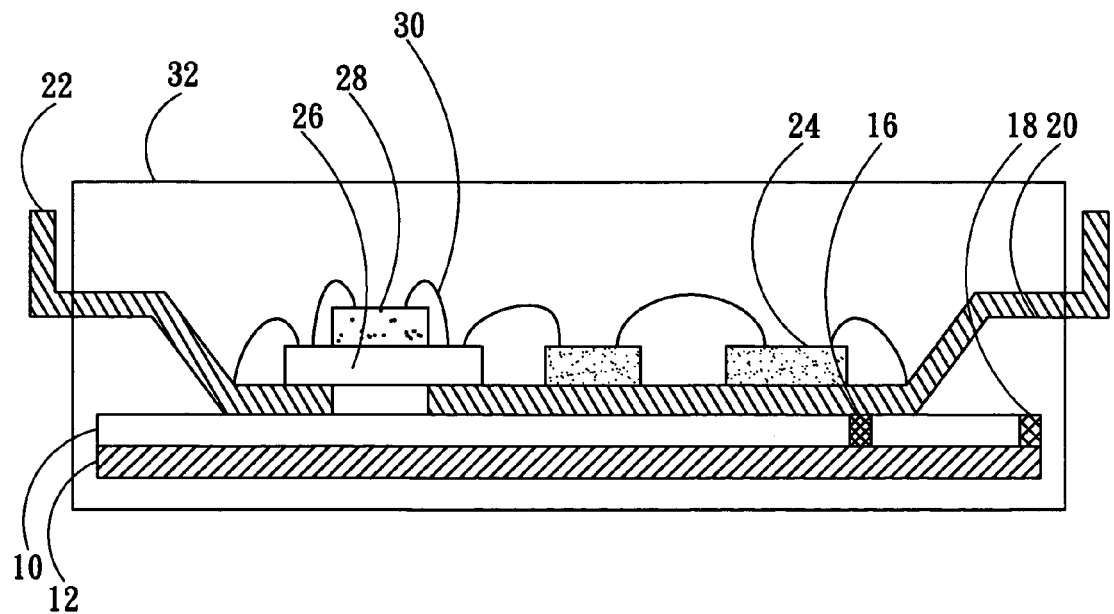
FIG. 4 is a cross-sectional view showing a molding compound to encapsulate the package device with electromagnetic interference shield in according to another embodiment of the present invention.

FIG. 4 illustrates another preferred embodiment of the present invention. The package device with electromagnetic interference shield includes a first substrate 10 without wirings, a shielding structure 12, a plurality of lead-frames 20, a plurality of first electronic devices 24, a second substrate 26, a plurality of second electronic devices 28, and a plurality of conductive wires 30. The shielding structure 12 located on the bottom surface of the first substrate 10 without wirings, the plurality of lead-frames 20 located on the first substrate 10 without wirings, each the plurality of first electronic devices 24 located on the plurality of lead-frames 20 respectively by die attach material (not shown in FIG. 4). The second substrate 26 located above between the two of plurality of lead-frames 20, and the plurality of second electronic devices 28 located on the second substrate 26 by using die attach material. The electricity between the plurality of lead-frames 20, the plurality of first electronic devices 24, the second substrate 26, and the plurality of second electronic devices 28 can electrically couple together by using the wire boding technology or die attach method according to the user requirement.

Similarly, the first substrate 10 without wirings includes at least a through hole 16 therein, and the through hole 16 is full with the conductor to conduct the electricity between the plurality of lead-frame 20 and the shielding structure 12. Otherwise, a thin conductive layer is formed on the side surface of the first substrate 10 without wirings to be a side connecting structure 18 to conduct the electricity between the plurality of lead-frames 20 and the shielding structure 12. It is noted that the conductor within the through hole 16 and the side connecting structure 18 can select to form in/on the first substrate 10 without wirings respectively, or both the conductor within the through hole 16 and the side connecting structure 18 can form in/on the first substrate 10 without wirings simultaneously in this preferred embodiment. In addition, the plurality of conductive wires 30 electrically coupled the electricity between the plurality of lead-frames 20, the second substrate 26, and the plurality of second electronic devices 28. Similarly, the electricity between the plurality of first electronic devices 24 and the second substrate 28, and the plurality of lead-frames 20 and the plurality of first electronic devices 24 is electrically coupled by using the plurality of conductive wires 30.

Next, the molding compound 32 is encapsulated to cover the plurality of first electronic devices 24, the plurality of second electronic devices 28, the portion of the plurality of lead-frames 20, the conductive wires 30, the first substrate 10 without wirings, and the shielding structure 12, and to expose the lead 22 of the plurality of lead-frames 20. The lead 22 of the plurality of lea-frames 20 used to electrically couple another outside electronic devices (not shown in figure). It is should be noted that the difference between the FIG. 3 and FIG. 4 is that the shielding structure 12 of FIG. 4 did not include the insulating layer 14 which located under the bottom surface of the first substrate 10 without wirings. Therefore, the cost of FIG. 4 is smaller than the cost of FIG. 3.

Figure 5:
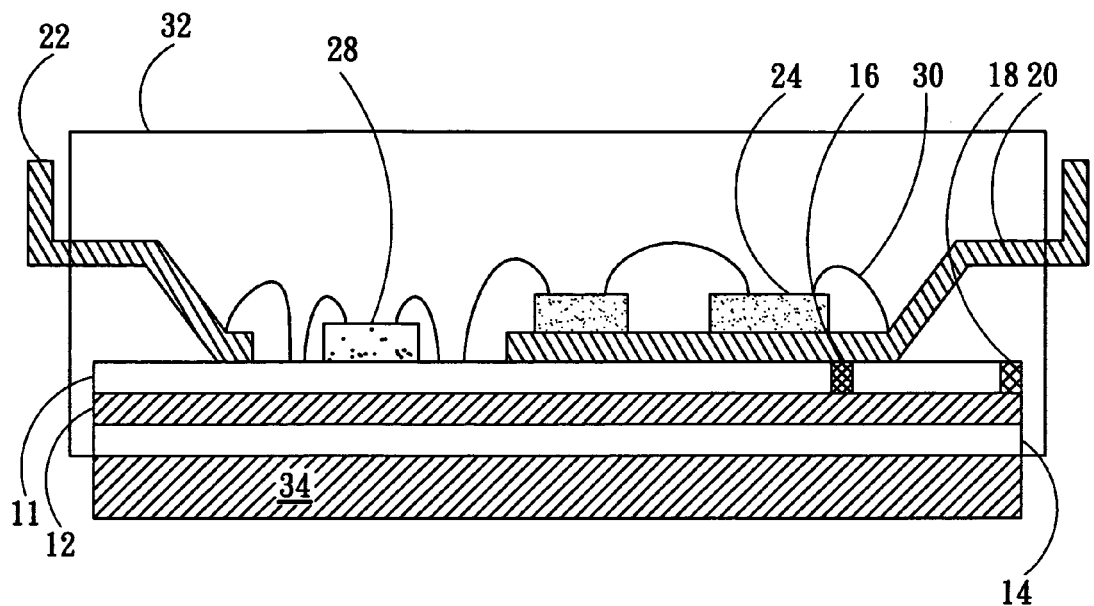
FIG. 5 is a cross-sectional view showing a package device with electromagnetic interference shield that includes a substrate with wirings therein, and a heat dissipation apparatus located under the substrate with wirings in according to the preferred embodiment of the present invention.

FIG. 5 shows another preferred embodiment of the package device with electromagnetic interference shield. The package device with electromagnetic interference shield includes a first substrate 11 with wirings, the shield structure 12, an insulating layer 14, a plurality of lead-frames 20, a plurality of first electronic devices 24, a plurality of second electronic devices 28, and the plurality of conductive wires 30.

The shielding structure 12 located under the bottom surface of the first substrate 11 with wirings, the insulating layer 14 located on the bottom surface of the shielding structure 12, the plurality of lead-frames 20 located on the first substrate 11 with wirings, the plurality of first electronic devices 24 located on the plurality of lead-frames 20, and a plurality of second electronic devices 28 located on the first substrate 11 with wirings. It is noted that both the plurality of first electronic devices 28 located on the plurality of lead-frames 20, and the plurality of second electronic devices 28 located on the first substrate 11 with wirings by using die attach material (not shown in FIG. 5). The plurality of second electronic devices 28 can be located on the first substrate 11 with wirings directly. In addition, the electricity between the plurality of lead-frames 20, the plurality of first electronic devices 24, the first substrate 11 with wirings, and the plurality of second electronic devices 28 can electrically connect together by using the wire boding technology or die attach method that according to the requirement.

Next, the molding compound 32 encapsulated to cover the plurality of first electronic devices 24, the plurality of second electronic devices 28, the portion of the plurality of lead-frames 20, the plurality of conductive wires 30, the first substrate 11 with wirings, the shielding structure 12, and the insulating layer 14, and to expose the side surface of the insulating layer 14. It should be noted that the shielding path constructed of the plurality of lead-frames 20, the conductor within the through hole 16, and the shielding structure 12. The shielding structure 12 electrically coupled with the grounded (not shown in FIG. 5). Thus, the electromagnetic/radio frequency can discharge from the shielding path through the shielding structure 12 to the grounded to discharge or eliminate the electromagnetic/radio frequency interference.

Figure 6:
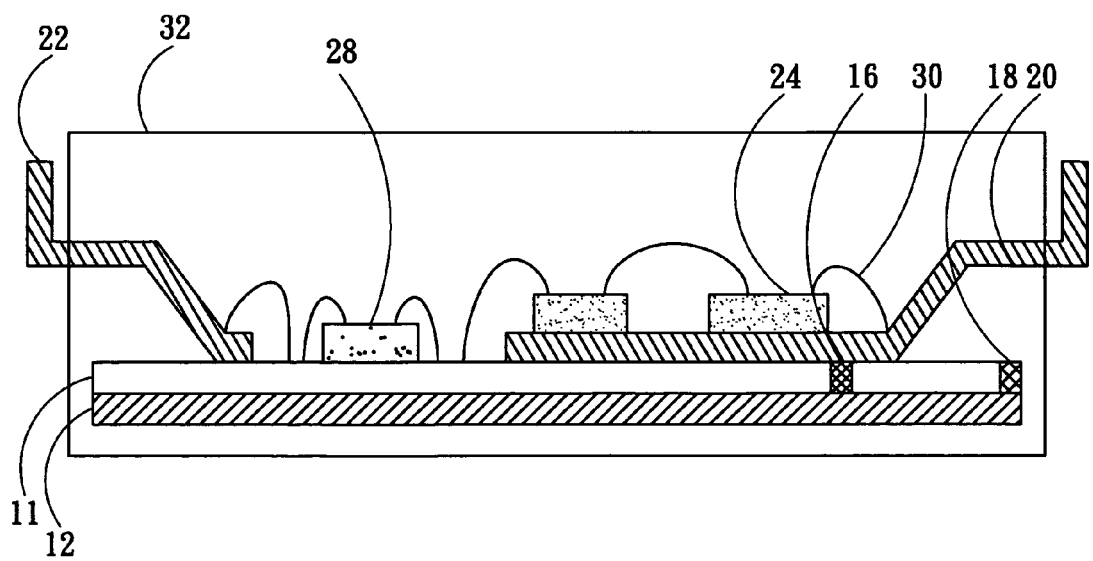
FIG. 6 is a cross-sectional view showing the molding compound to encapsulate the substrate with wirings thereon for the package device with electromagnetic interference shield in according to the preferred embodiment of the present invention.

FIG. 6 shows further embodiment of the package device with electromagnetic interference shield according to the present invention. The package device with electromagnetic interference shield includes a first substrate 11 with wirings thereon/therein, a shielding structure 12, a plurality of lead-frames 20, a plurality of first electronic devices 24, a plurality of second electronic devices 28, and a plurality of conductive wires 30. The shielding structure 12 located on the bottom surface of the first substrate 11 with wirings, the plurality of lead-frames 20 located on the top surface of the first substrate 11 with wirings, the plurality of first electronic devices 24 located on the plurality of lead-frames 20 and the plurality of second electronic devices 28 located on the first substrate 11 with wirings by using die attach material (not shown). The first substrate 11 with wirings includes an electrical connecting structure, such as the conductor within the through hole 16. The conductor within the through hole 16 can conduct the electricity between the plurality of lead-frames 20 and the shielding structure 12. On the other hand, the electrical connecting structure can be the thin conductive layer that is formed on the side surface of the first substrate 11 with wirings to be a side connecting structure, which conducts the electricity between the plurality of lead-frames 20 and the shielding structure 12. In addition, the plurality of conductive wires 30 electrically coupled the electricity between the plurality of lead-frames 20 and the plurality of second electronic devices 28. Similarly, the electricity between the plurality of first electronic devices 24 and the plurality of lead-frames 20 and the plurality of first electronic devices 24 is electrically coupled by using the plurality of conductive wires 30.

Thereafter, the molding compound 32 is encapsulated to cover the first substrate 11 with wirings, and the shielding structure 12, and to expose the lead 22 of the plurality of lead-frames 20. The lead 22 of the plurality of lead-frames 20 used to electrically couple to outside of other electronic devices. It is noted that the difference between FIG. 6 and FIG. 5 is that the shielding structure 12 did not include the insulating layer 14 that located under the bottom surface of the first substrate 11 with wirings. Therefore, the size of the package device with electromagnetic interference shield of FIG. 6 is smaller than the size of the package device with electromagnetic interference shield of FIG. 5.

Figure 7:
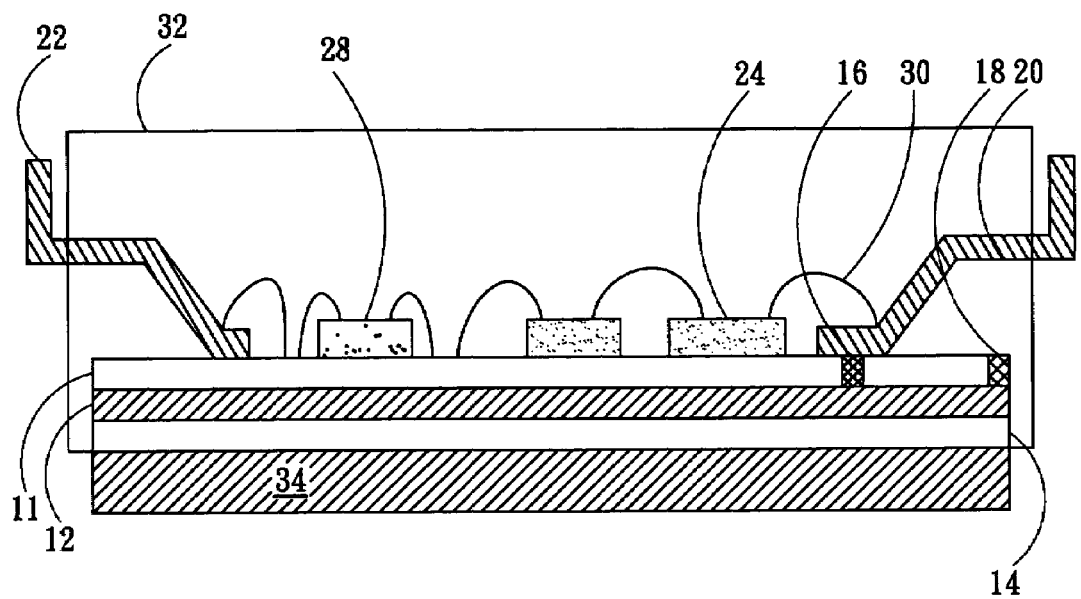
FIG. 7 is a cross-sectional view showing a package device with electromagnetic interference shield that includes a substrate with wirings thereon and heat dissipation apparatus located under the substrate in according to the preferred embodiment of the present invention.

FIG. 7 shows another preferred embodiment of the package device with electromagnetic interference shield in according to present invention. The package device with electromagnetic interference shield includes a first substrate 11 with wirings thereon/therein, the plurality of lead-frames 20, a plurality of first electronic devices 24, a plurality of second electronic devices 28, and a plurality of conductive wires 30. the shielding structure 12 located on the top surface of the first substrate 11 with wirings, the plurality of first electronic devices 24 located on the top surface of the first substrate 11 with wirings and the plurality of second electronic devices 28 located on the first substrate 11 with wirings by suing die attach material (not shown in FIG. 7). Also, the electricity between the plurality of lead-frames 20, the plurality of first electronic devices 24, the first substrate 11 with wirings, and the plurality of second electronic devices 28 can electrically connect by using the wire bonding technology or die attach method according to the requirement.

In addition, the first substrate 11 with wirings includes an electrical connecting structure such as the conductor within the through hole 16, or the thin conductive layer used to be the side connecting structure 18 that is formed on the side surface of the first substrate 11 with wirings. Both the conductor within the through hole 16 and the side connecting structure 18 are used to electrically couple with the plurality of lead-frames 20 and the shielding structure 12. It is noted that the conductor within the through hole 16 and the side connecting structure 18 can select to form in/on the first substrate 11 with wirings respectively, or both the conductor within the through hole 16 and the side connecting structure 18 form in/on the first substrate 11 with wirings simultaneously.

Thereafter, the molding compound 32 is encapsulated to cover the first substrate 11 with wirings, the shielding structure 12, and to expose the lead 22 of the plurality of lead-frames 20. The lead 22 of the plurality of lead-frame 20 is electrically coupled to outside of other electronic devices.

Figure 8:
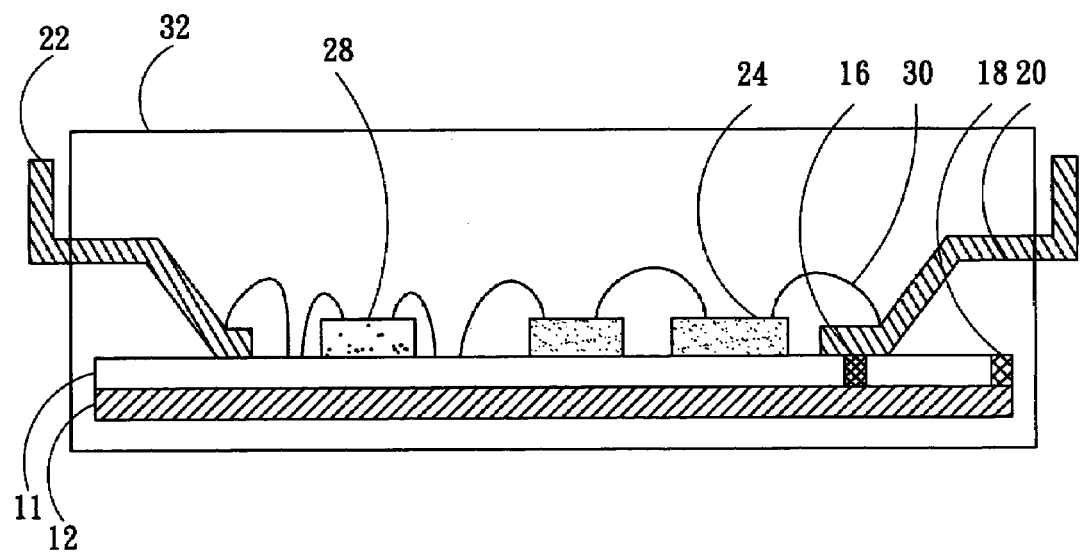
FIG. 8 is a cross-sectional view showing the molding compound to encapsulate the substrate with wirings for the package device with electromagnetic interference shield in according to another preferred embodiment of the present invention.

FIG. 8 shows a further preferred embodiment of the package device with electromagnetic interference shield in according to the present invention. The package device with electromagnetic interference shield includes a first substrate 11 with wirings thereon/therein, a plurality of first electronic devices 24, a plurality of second electronic devices 28, and the plurality of conductive wires 30. The shielding structure 12 located on the first substrate 11 with wirings, the plurality of second electronic devices 28 located on the first substrate 11 with wirings which adjacent to the plurality of first electronic devices 24. The plurality of conductive wires 30 electrically coupled the electricity between the plurality of lead-frames 20, the plurality of first electronic devices 24, and the plurality of second electronic devices 28 respectively.

The package device with electromagnetic interference shield further includes a shielding structure 12 that located on the bottom surface of the first substrate 11 with wirings, wherein the shielding structure 12 connects to the grounded (not shown in FIG. 8). At least a through hole 16 located within the first substrate 11 with wirings and passed through the first substrate 11 with wirings to the shielding structure 12. In addition, the through hole is full with the conductor 16 by using electroplating method. Thus, the conductor within the through hole 16 can electrically couple with the plurality of lead-frames 20 and the shielding structure 12. Otherwise, the thin conductive layer is formed on the side surface of the first substrate 11 with wirings to be a side connecting structure 18 which conducts and electrically couples the electricity between the plurality of lead-frames 20 and the shielding structure 12. In this preferred embodiment, the electricity between the plurality of lead-frames 20, the plurality of first electronic devices 24, the first substrate 11 with wirings, and the plurality of second electronic devices 28 is electrically coupled together by using wire bonding technology or die attach technology.

Then, the molding compound 32 is encapsulated to cover the plurality of first electronic devices 24, the plurality of second electronic devices 28, the plurality of lead-frames 20, the first substrate 11 with wirings, the plurality of conductive wires 30, and the shielding structure 12, and to expose the lead 22 of the plurality of lead-frames 20. The lead 22 of the plurality of lead-frames 20 is electrically coupled to other electronic devices outside of the package device with electromagnetic interference shield. It is noted that the difference between FIG. 7 and FIG. 8 is that the shielding structure 12 did not include the insulating layer 14 (as shown in FIG. 7), and the molding compound 32 covered the shielding structure 12.

Figure 9:
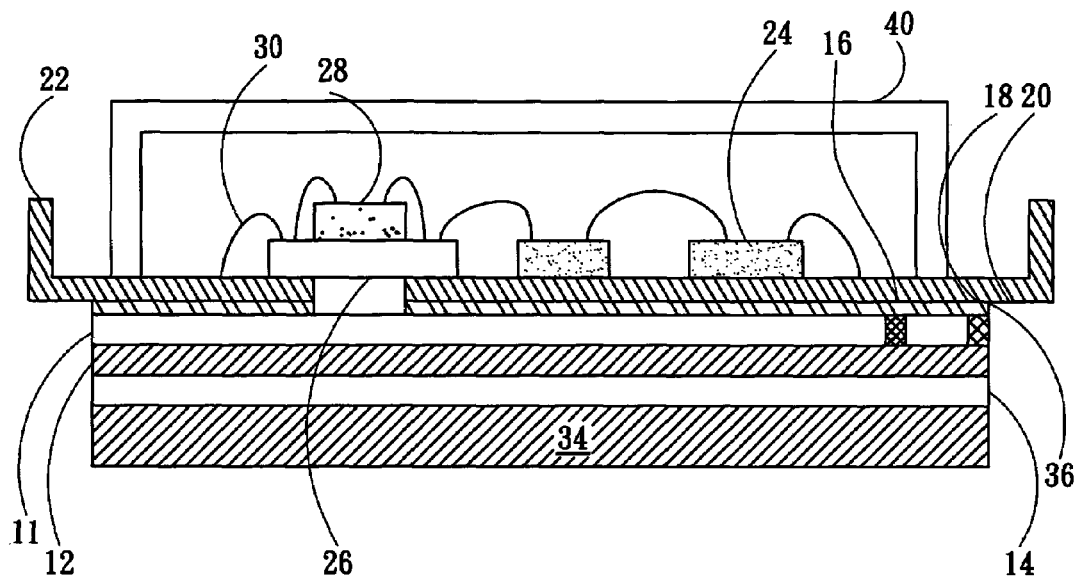
FIG. 9 is a cross-sectional view showing the housing to encapsulate the package device with electromagnetic interference shield in according to preferred embodiment of the present invention.

FIG. 9 shows another preferred embodiment of the package device with electromagnetic interference shield. The package device with electromagnetic interference shield includes a first substrate 11 with wirings, a shielding structure 12, a conductive layer 36, the plurality of lead-frames 20, a plurality of first electronic devices 24, a plurality of second electronic devices 28 a second substrate 26, the plurality of conductive wires 30, and a housing 40. The shielding structure 12 located on the bottom surface of the first substrate 11 with wirings, and electrically coupled to the grounded (not shown in FIG. 9). The conductive layer 36 located on the top surface of the first substrate 11 with wirings, and the plurality of lead-frames 20 located on the top surface of the conductive layer 36. The plurality of first electronic devices 24 located on the plurality of lead-frames 20, the second substrate 26 that located on the plurality of lead-frames 20, and the plurality of second electronic devices 28 that located on the second substrate 26. The plurality of first electronic devices 24 is located on the plurality of lead-frames 20 and the plurality of second electronic devices 28 is located on the second substrate by die attach material (not shown) respectively. Furthermore, the plurality of conductive wires 30 is formed by using wire bonding technology to electrically couple the electricity between the plurality of first electronic devices 24, the plurality of lead-frames 20, the second substrate 26, and the plurality of second electronic devices 28.

Then, a housing 40 is positioned to cover the top of the first substrate 11 with wirings and to expose the leads 22 of the plurality of lead-frames 20. The capability of the housing 40 is good conductivity and is made of the metal. The housing 40 used to against the electromagnetic/radio frequency interference which is generated by the outside environment from outside environment.

Figure 10:
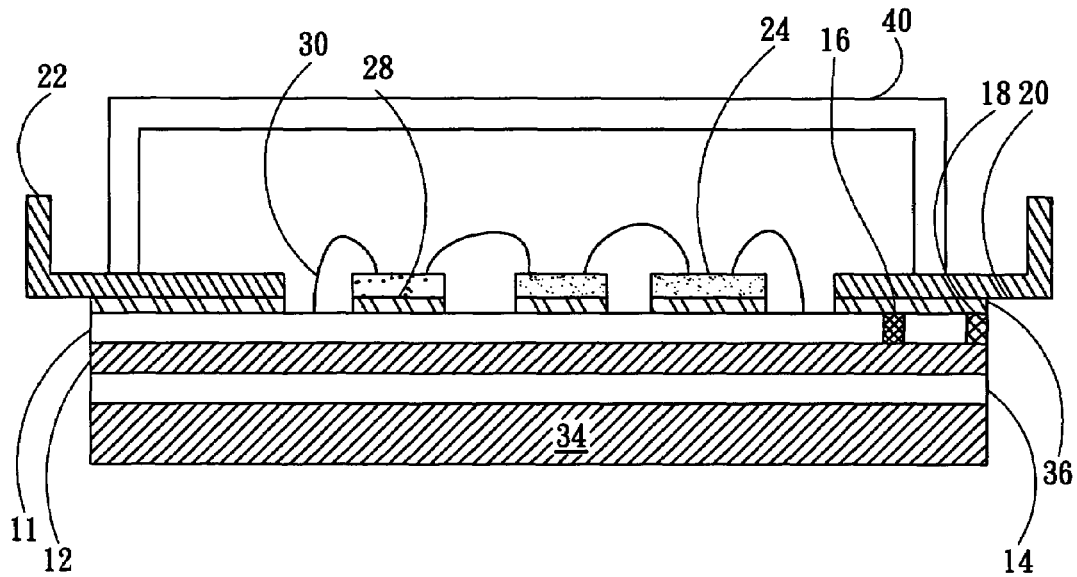
FIG. 10 is a cross-sectional view showing a housing to encapsulate the substrate with wirings and heat dissipation apparatus located under the substrate with wirings for a package device with electromagnetic interference shield.

FIG. 10 shows a further preferred embodiment of the package device with electromagnetic interference shield in according to the present invention. The package device with electromagnetic interference shield includes a first substrate 11 with wirings, a shielding structure 12, an insulating layer 14, a plurality of first electronic devices 24, a plurality of second electronic devices 28, a plurality of conductive wires 30, a conductive layer 36, and a housing 40. The shielding structure 12 located on the bottom surface of the first substrate 11 with wirings, and an insulating layer 14 located on the bottom surface of the shielding structure 12. The plurality of first electronic devices 24 located on each plurality of conductive layers 36, and the plurality of second electronic devices 28 is positioned on one of plurality of conductive layers 36 by using die attach material. Also, the electricity between the plurality of conductive layers 36, the plurality of lead-frames 20, the plurality of first electronic devices 24, and the plurality of second electronic devices 28 can electrically connect by using wire boding technology or die attach method according to the requirement.

The difference between FIG. 9 and FIG. 10 is that the encapsulating structure is housing 40 with good conductivity. Thus, the housing 40 can against the electromagnetic/radio frequency interference which is generated from the outside environment.

Furthermore, the package device with electromagnetic interference shield further includes a heat dissipation apparatus 34 that is positioned under the insulating layer 14. therefore, the electromagnetic/radio frequency can discharge to the grounded (not shown) from the conductive layer 36, the conductor within the through hole 16 or discharge from the side connecting structure 18 through the shielding structure 12 to the grounded to reduce the electromagnetic/radio frequency interference for the package device with electromagnetic interference shield. On the other hand, the heat is removed from the conductive layer 36 through the conductor within the through hole 16 or removed from the side connecting structure 18 to the shielding structure 12 to the outside of the package device with an electromagnetic interference shield.

Although specific embodiments have been illustrated and described, it will be obvious to those skilled in the art that various modifications may be made without departing from what is intended to be limited solely by the appended claims.

What is claimed is:

1. A semiconductor package device, comprising:
   a first substrate having a bottom surface, a top surface opposite to said bottom surface, a shielding structure and an electrical connecting structure, said shielding structure located on said bottom surface of said first substrate;
   a plurality of lead-frames positioned on said top surface of said first substrate;
   a plurality of conductive wires;
   a plurality of first electronic devices electrically connected with each other via said plurality of conductive wires; and
   a circuit ground, said shielding structure electrically connected said circuit ground and one of said lead-frames via said electrical connecting structure.

2. The semiconductor package device according to claim 1, wherein said electrical connecting structure is a through hole with a conductor therein, and said through hole is passed through said first substrate.

3. The semiconductor package device according to claim 1, wherein said electrical connecting structure is a conductive layer which located on a side surface of said first substrate.

4. The semiconductor package device according to claim 1, wherein said first substrate having wirings therein.

5. The semiconductor package device according to claim 1, wherein said first substrate without wirings therein.

6. The semiconductor package device according to claim 1, wherein the material of said shielding structure is metal plate or a metal layer.

7. The semiconductor package device according to claim 1, wherein said plurality of first electronic devices is positioned on said plurality of lead-frames, and is electrically coupled with said plurality of lead-frames by said plurality of conductive wires.

8. The semiconductor package device according to claim 1, wherein said plurality of first electronic devices is positioned on said top surface of said first substrate, and is electrically coupled with said first substrate by said plurality of conductive wires.

9. The semiconductor package device according to claim 1, further comprising a second substrate located between said plurality of lead-frames and on said top surface of said first substrate.

10. The semiconductor package device according to claim 9, further comprising a plurality of second electronic devices located on said second substrate, and is electrically coupled with said second substrate by said plurality of conductive wires.

11. The semiconductor package device according to claim 1, further comprising a plurality of second electronic devices located on said top surface of said first substrate, and is electrically coupled with said first substrate by said plurality of conductive wires.

12. The semiconductor package device according to claim 1, further comprising an insulating layer located below said shielding structure.

13. The semiconductor package device according to claim 12, further comprising a heat dissipation apparatus located below said insulating layer.

14. The semiconductor package device according to claim 1, further comprising a heat dissipation apparatus located below said shielding structure.

15. The semiconductor package device according to claim 1, further comprising a molding compound encapsulated to cover said first substrate, said plurality of first electronic devices, a portion of said plurality of lead-frames, and said plurality of conductive wires.

16. The semiconductor package device according to claim 1, further comprising a housing encapsulate to cover said first substrate, said plurality of first electronic device, a portion of said plurality of lead-frames, and said plurality of conductive wires.

17. A semiconductor package device with an electromagnetic interference shield, comprising:
   a first substrate with a wirings therein/thereon and a shielding structure on a bottom surface of said first substrate;
   a plurality of lead-frames being located on said first substrate with said wirings;
   a plurality of first electronic devices located on said first substrate with said wirings;
   a plurality of second electronic devices located on said first substrate with said wirings; and
   a plurality of conductive wires is electrically coupled with said first substrate with said wirings and said plurality of first electronic devices, and is electrically coupled with each said plurality of first electronic devices, said second plurality of electronic devices, and said first substrate with said wirings.

18. The semiconductor package device with an electromagnetic interference shield according to claim 17, further comprising a through hole be passed through said first substrate, and a conductor is full within said through hole.

19. The semiconductor package device with an electromagnetic interference shield according to claim 17, further comprising a conductive layer located on a side surface of said first substrate with said wirings to be an end electrical connecting structure.

20. The semiconductor package device with an electromagnetic interference shield according to claim 17, further comprising a grounded is electrically coupled with said shielding structure.

21. The semiconductor package device with an electromagnetic interference shield according to claim 17, wherein the material of said shielding structure is a metal plate or a metal layer.

22. The semiconductor package device with an electromagnetic interference shield according to claim 17, further comprising an insulating layer located above said shielding structure.

23. The semiconductor package device with an electromagnetic interference shield according to claim 22, further comprising a heat dissipation apparatus located above said insulating layer.

24. The semiconductor package device with an electromagnetic interference shield according to claim 17, further comprising a heat dissipation apparatus is located above said shielding structure.

25. The semiconductor package device with an electromagnetic interference shield according to claim 17, further comprising a molding compound encapsulates to cover said first substrate, said plurality of first electrical devices, said plurality of second electronic devices, said plurality of lead-frames, and said plurality of conductive wires.

26. The semiconductor package device with an electromagnetic interference shield according to claim 17, further comprising a housing encapsulates to cover said first substrate, said plurality of first electronic devices, said second plurality of electronic devices, said plurality of lead-frames, and said plurality of conductive wires.

* * * * *